United States Patent [19]

Yajima et al.

[11] Patent Number: 4,836,868
[45] Date of Patent: Jun. 6, 1989

[54] PERMANENT MAGNET AND METHOD OF PRODUCING SAME

[75] Inventors: Kohichi Yajima, Urawa; Osamu Kohmoto, Kamagaya; Tetsuhito Yoneyama, Narashino, all of Japan

[73] Assignee: TDK Corporation, Tokyo, Japan

[21] Appl. No.: 38,195

[22] Filed: Apr. 14, 1987

[30] Foreign Application Priority Data

| Apr. 15, 1986 | [JP] | Japan | 61-86850 |
| Apr. 23, 1986 | [JP] | Japan | 61-94247 |
| May 14, 1986 | [JP] | Japan | 61-109970 |
| May 14, 1986 | [JP] | Japan | 61-109971 |
| May 14, 1986 | [JP] | Japan | 61-109972 |
| May 15, 1986 | [JP] | Japan | 61-111087 |
| Feb. 5, 1987 | [JP] | Japan | 62-23509 |
| Mar. 9, 1987 | [JP] | Japan | 62-52215 |
| Mar. 17, 1987 | [JP] | Japan | 62-62198 |

[51] Int. Cl.$^4$ .................................................. H01F 1/04
[52] U.S. Cl. .................................. 148/302; 420/83; 420/121; 75/244
[58] Field of Search .................... 148/302; 420/83, 121

[56] References Cited

U.S. PATENT DOCUMENTS 4,533,408  8/1985  Koon ................................ 148/103
4,601,875  7/1986  Yamamoto et al. ................. 419/23

FOREIGN PATENT DOCUMENTS

| 0108474 | 5/1984 | European Pat. Off. ............ 148/302 |
| 0125752 | 11/1984 | European Pat. Off. . |
| 57-141901 | 9/1982 | Japan . |
| 59-211549 | 11/1984 | Japan . |
| 60-9852 | 1/1985 | Japan . |
| 60-89546 | 5/1985 | Japan . |
| 60-224761 | 10/1985 | Japan . |
| 61-73861 | 4/1986 | Japan . |

Primary Examiner—John P. Sheehan
Attorney, Agent, or Firm—Burgess, Ryan & Wayne

[57] ABSTRACT

In an R-Fe-B permanent magnet produced by a process including a rapid cooling, a composition of $$\{R_a(Ce_bLa_{1-b})_{1-a}\}x(Fe_{1-z}Co_z)_{100-x-y-w}B_yM_w$$

(R is at least one rare earth element except for La and Ce but including Y, $5.5 \leq x < 12$, $2 \leq y < 15$, $0 \leq z \leq 0.7$, $0 < w \leq 10$, $0.80 \leq a \leq 1.00$, $0 \leq b \leq 1$, M is Zr, Nb, Mo, Hf, Ta, W, Ti, and/or V) is proposed. The presence of the M element increases a ((BH)max) to a value higher than that of a composition wherein x is higher than 12 and makes the magnet more easily magnetizable.

21 Claims, 4 Drawing Sheets

PERMANENT MAGNET AND METHOD OF PRODUCING SAME

BACKGROUND OF THE INVENTION

1. Field of the Invention

The present invention relates to a high performance-permanent magnet used for various electrical appliances, particularly a rapidly cooled magnet of the rare earth-containing alloy system, as well as to a method for producing the same. The present invention provides a magnet exhibiting improved magnetic properties by rapidly cooling an alloy melt of the Fe-R-B system (R is a rare earth element(s) including Y, ditto hereinafter) or Fe-Co-R-B system. The present invention proposes to anneal, under specified conditions, the rapidly cooled and then solidified magnet, to homogenize and stabilize the magnetic properties.

2. Description of the Related Arts

High performance rare earth magnets are Sm-Co magnets which are mass produced by powder metallurgy. Although such Sm-Co magnets can exhibit a maximum energy product of 32 MGOe, they are disadvantageous in that the Sm and Co raw materials are very costly. Such elements as cerium, praseodymium, and neodymium, among the rare earth elements, have a smaller atomic mass than samarium and are inexpensive. In addition, iron is inexpensive. Accordingly, Nd-Fe-B magnets have been recently developed. Regarding these magnets, Japanese Unexamined Patent Publication No. 59-46008 describes sintered magnets, and Japanese Unexamined Patent Publication No. 60-9852 describes rapidly cooled magnets. Although the conventional powder metallurgy process of the Sm and Co powder can be applied to the sintered magnets, they do not utilize the advantage of inexpensive raw materials in one aspect; that is, an alloy ingot of the easily oxidizable Nd-Fe must be finely pulverized to a size of from approximately 2 to 10 $\mu$m, and thus the treatment process thereof is difficult to carry out. In another aspect, the powder metallurgy process includes a number of processes, such as melting, casting, rough crushing of ingot, fine crushing, pressing, sintering, and shaping as a magnet.

On the other hand, the rapidly cooled magnet is advantageous in that it is produced by a simplified process wherein the fine pulverizing process is omitted. Nevertheless, an enhancement of the coercive force and energy product, and cost-reductios as well as an improvement in the magnetizing property must be realized to make the rapidly cooled material industrially usable.

In the properties of the rare earth-iron-boron magnet, the coercive force has a temperature sensitive characteristic. The temperature coefficient of coercive force (iHc) is 0.15%/°C. for the rare earth cobalt magnet, but the temperature coefficient of coercive force (iHc) is from 0.6 to 0.7%/°C. for the rare earth-iron-boron magnet; thus being four or more times higher than that of the rare earth cobalt magnet. In the rare earth-iron-boron magnet, there is a serious danger of demagnetization upon a rise in temperature, with the result that the design of a magnetic circuit is limited. In addition, this type of magnet is unusable, for example, for parts in an engine room of automobiles used in tropical regions.

Japanese Unexamined Patent Publication No. 60-9852 claims a composition of 10% or more of rare earth element(s) of Nd or Pr, from 5 to 10% of B, and a balance of Fe, in which composition a high coercive force (iHc) is allegedly provided to the R-Fe-B alloy by a rapid cooling. Heretofore, the outstanding magnetic properties of the R-Fe-B alloy were thought to be attributable to the $Nd_2Fe_{14}B$ compound-phase. Accordingly, with regard to both the sintering method and rapid cooling method, a number of proposals for improving the magnetic properties (Japanese Unexamined Patent Publications Nos. 59-89401, 60-144906, 61-79749, 57-141901, and 61-73861) were based on the experiments of the composition in the vicinity of the above compound, i.e., R=12~17%, and B=5~8%.

Since the rare earth elements are expensive, preferably the content thereof is low. There is a problem, however, in that the coercive force (iHc) is greatly reduced at a rare earth element content of less than 12%. Note, the coercive force (iHc) is reduced to 6 kOe or less at a rare earth element content of 10% or less, as described in Japanese Unexamined Patent Publication No. 60-9852. In the R-Fe-B alloy, therefore, the coercive force (iHc) is reduced at a rare earth element content of less than 12%. A method of preventing the decrease in the coercive force (iHc) in the composition range as described above, by changing the composition and structure, is not known.

Although the $Nd_2Fe_{14}B$ compound is the basic compound used in both the sintering method and the rapid cooling method, the magnets produced by these methods not only are different in the production methods but also belong to fundamentally different types of magnets, in view of the alloy structure and coercive force-generating mechanism, as described in Oyobuturi (Applied Physics) No. 55, Vol. 2 (1986), page 121. Namely, in the sintered magnet, the grain size is approximately 10 $\mu$m. A magnet with such a grain size is, compared with the conventional Sm-Co magnet, a nucleation type, in which the nucleation of inverse magnetic domains determine the coercive force. On the other hand, the rapidly cooled magnet is a pinning type, in which the coercive force is determined by the pinning of the magnetic domain-wallls due to the extremely fine structure of fine particles from 0.01 to 1 $\mu$m in size surrounded by amorphous phases. Accordingly, any approach to an improvement the properties of the magnets must first fully consider the differences in the generation mechanisms of the coercive force.

SUMMARY OF THE INVENTION

The present invention is based on the rapid cooling method, in which non-equilibrium phases can be used in addition to the equilibrium phases, and the effects of various elements on the Fe-Re(Co)-B alloy have been investigated. As a result, it was found that the addition of any one of the specific elements, i.e., Zr, Nb, Mo, Hf, Ta, W, Ti, and V, will provide a high performance magnet exhibiting a high coercive force and energy product, notwithstanding a small rare earth element content of less than 12%, and the isotropic property of the magnet. The effectiveness of the additional elements according to the present invention are peculiar to the rapidly cooled magnet and cannot be realized in sintered magnets.

It was further found that the above additional elements improve the magnetizing characteristics and corrosion resistance of the rapidly cooled R-Fe(Co)-B alloy.

In accordance with the objects of the present invention, there is provided a permanent magnet consisting of:

$$R_a(Ce_bLa_{1-b})_{1-a} \times (Fe_{1-z}Co_z)_{100-x-y-w}B_yM_w$$

(R is at least one rate earth element except for La and Ce but including Y, $5.5 \leq x < 12$, $2 \leq y < 15$, $0 \leq z \leq 0.7$, $0 < w \leq 108$ $0.80 \leq a \leq 1.00$, $0 \leq b \leq 1$, M is at least one element selected from the group consisting of Zr, Nb, Mo, Hf, Ta, W, Ti, and V); and, fine crystals and mixed phases of fine crystals and amorphous phases.

The permanent magnet according to the present invention is obtained by rapidly cooling and solidifying the R-Fe-B or R-Fe(Co)-B alloy melt having the above composition by means of so-called liquid-rapid cooling methods. In these rapid cooling methods, melt is injected onto a rotary metallic body cooled by, for example, water, to cool and solidify the melt at a high speed and to obtain material in the form of a ribbon. In this connection, the disc method, single roll method, and twin roll method can be used. In the present invention, the single roll method, i.e., the method of directly injecting the melt onto the circumferential surface of a single rotary roll, is most appropriate. The circumferential speed of the water-cooled, cooling roll is desirably in the range of from 2 to 100 m/sec when a single roll method is employed, to obtain the magnet according to the present invention, because at a circumferential speed of less than 2 m/sec and more than 100 m/sec, the coercive force (iHc) tends to be low. A circumferential speed of from 5 to 30 m/sec is desirable for obtaining a high coercive force (iHc) and energy product. By rapidly cooling and solidifying the alloy melt having the composition as described above by a single roll method at a circumferential speed of 2 to 100 m/sec, it is possible to obtain a magnet exhibiting a coercive force (iHc) up to 20 kOe, and a magnetization ($\sigma$) of from 65 to 150 emu/gr. By rapid cooling directly from the melt, an amorphous or extremely fine crystalline structure, and thus a magnet having improved prperties as described above, are obtained. The structure obtained by rapid cooling depends on the cooling condition and is amorphous or is composed of a mixed phase of amorphous and fine crystals. The fine crystalline structure or the mixed phase structure of amrophous and fine crystals, and the size of the constituent phases of the structure, can be further controlled by annealing, to enhance the magnetic properties. The magnetic properties are enhanced when at least 50% of the fine crystals has a size in the range of from 0.01 to less than 3 $\mu$m, preferably from 0.01 to less than 1 $\mu$m. The amorphous-free structure provides higher magnetic properties than the mixed phase structure.

The annealing of a magnet rapidly cooled and solidified by the liquid-rapid cooling method is carried out at a temperature range of from 300° to 900° C. for 0.001 to 50 hours in an inert gas atmosphere or a vacuum. The rapidly cooled magnet having a composition according to the present invention and subjected to the annealing, becomes insensitive to the conditions for rapid cooling, thereby stabilizing the magnetic properties. Annealing at a temperature of less than 300° C. will not stabilize the properties, and annealing at a temperature exceeding 900° C. results in a drastic decrease of the coercive force (iHc). Annealing for less than 0.001 hour will not stabilize the magnetic properties, and an annealing exceeding 50 hours does not further improve the magnetic properties but merely causes economic disadvantages.

It is possible to further improve the magnetic properties by applying a magnetic field to the magnet during annealing.

The magnet obtained by the rapid cooling method is usually in the form of a ribbon. This ribbon is pulverized to form powder preferably into particles having a diameter of from 30 to 500 $\mu$m. The obtained powder is usually cold-pressed or warm-pressed to obtain a bulk magnet having a high density. Namely, the bonded magnet can be produced by using the ribbon magnet obtained by the liquid-rapid cooling method. In this case, a powder which may be occasionally obtained by the rapid cooling method, is also used for producing the bonded magnet, by pulverizing and then annealing the powder, if necessary, followed by bonding with the aid of an organic resin, metallic binder and the like. Anisotropy may be imparted to the magnet by hot-pressing, extrusion, rolling, swaging, or forging.

The composition according to the present invention will now be described.

The content (x) of the rare earth element is from 5.5 to less than 12%, since the coercive force (iHc) is reduced at a content of less than 5.5%, and further, the energy product is high at a content of less than 12% in the case of an isotropic magnet, to which category the magnet according to the present invention belongs. A further high energy product can be obtained at a rare earth element content of less than 10%. When the sum of La and Ce in the case of a combined addition exceeds 20% of the total content of rare earth elements, the energy product is disadvantageously reduced. Accordingly, $0.80 \leq a \leq 1.00$ is set as the preferable content. Sm decreases the anisotropic constant, and thus is preferably kept at a content of 20% at the highest. The content (y) of boron (B) is from 2% to less than 15%, since at a content of less than 2%, the coercive force (iHc) is low, and further, at a content of 15% or more, the residual magnetization (Br) is reduced. Up to 50% of the boron content may be replaced with one or more of Si, Ga, Al, P, N, Ce, S, and the like; the effects of which are similar to those of B, Co, which may replaced Fe, improves the magnetic properties and enhances the Curie point. When, however, the replaced amount (z) exceeds 0.7%, the coercive force (iHc) is reduced. The M content (w) of any one of Zr, Nb, Mo, Hf, Ta, W, Ti, and V is less than 10%, since the magnetization is drastically decreased at a content of more than 10%. A content (w) of 0.1% or more is preferred in view of the coercive force (iHc), and a content (w) of 0.5% or more, especially 1% or more, is preferred in view of the corrosion resistance. A composite addition of two or more of the elements M gives a greater enhancement of the coercive force (iHc) than a single addition. The upper limit for an additive amount of two or more of the elements M is 10%.

The preferred contents for obtaining a high energy product are: $5.5 \leq x < 10$; $4 \leq y \leq 12$, more preferably $4 \leq y \leq 10$; $0.1 \leq W \leq 10$; $0 \leq z \leq 0.6$; and, $2 \leq w \leq 10$. The preferred contents for obtaining an improved magnetizing characteristic are: $6 \leq x < 12$, preferably $6 \leq x < 10$; $4 \leq y \leq 12$; $0.1 \leq W \leq 10$; more preferably $4 \leq y \leq 10$; $0 \leq z \leq 0.6$; and, $2 \leq w \leq 10$. In addition to the Melement(s), Cr, Mn, Ni, Cu, and/or Ag may be added in such an amount not degrading the effects of the Melement(s).

The present invention is further described with reference to the drawings.

DESCRIPTION OF THE PREFERRED EMBODIMENTS

Note, the magnet in the form of a ribbon obtained by the liquid-rapid cooling method, the magnet obtained by pulverizing the ribbon and shaping the powder into a bulk, as well as the bonded magnet, are known, for example, in Japanese Unexamined Patent Publication No. 59-211549. However, the conventional magnet needs, in order to carry out magnetizing until a saturation magnetization is reached, a magnetizing field of not less than 40 kOe and up to 100 kOe, as described in J.A.P. 60 (10), vol. 15 (1986), page 3685. The conventional magnet, therefore, cannot be magnetized until the saturation magnetization is realized by an ordinary electromagnet at a magnetic field of from 15 to 20 kOe.

Figure 1:
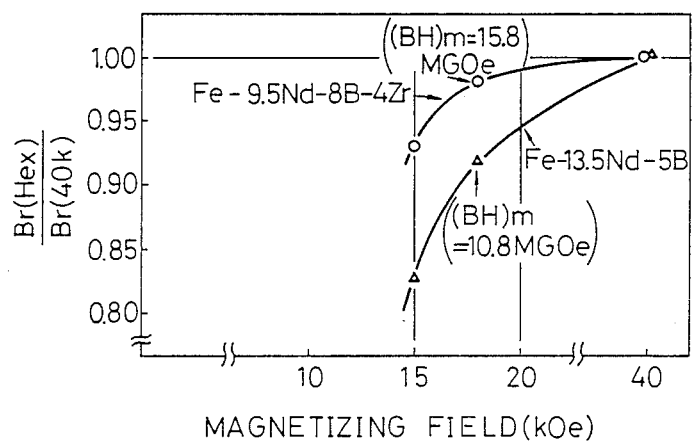
FIG. 1 is a graph illustrating the magnetizing characteristic.

Referring to FIG. 1, Fe-13.5Nd-5B is an example of the conventional magnet, and Fe-9.5Nd-8B-4Zr is an example of the magnet according to the present invention. In the figure, the abscissa indicates the magnetizing field (kOe), and the ordinate indicates the ratio of residual magnetization (Br(40k)) at a magnetizing field of 40 kOe, relative to a given magnetic field (Hex). This ratio is referred to as the magnetizing ratio. As illustrated in FIG. 1, a full magnetizing in terms of 95% or more is advantageously possible at a low magnetizing field of approximately 20 kOe.

Figure 2:
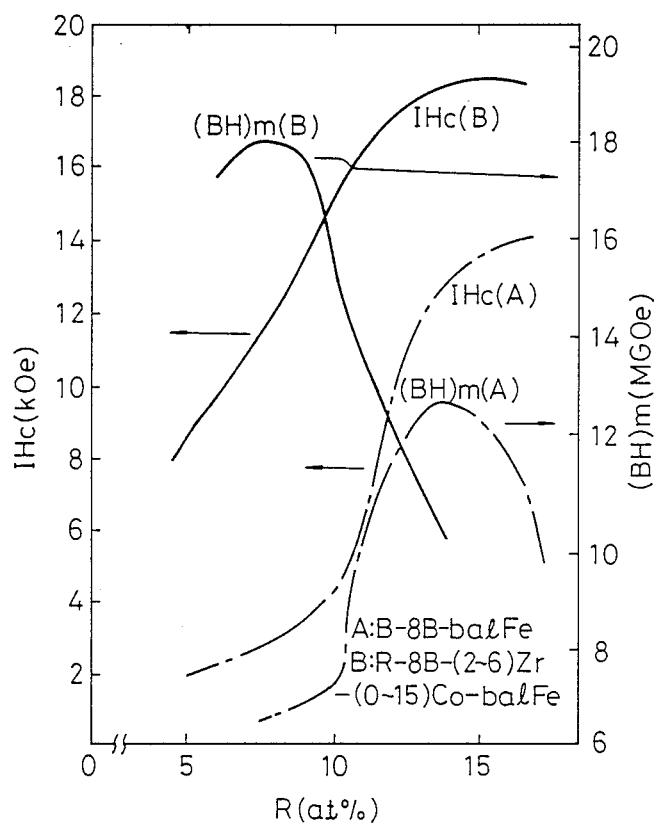
FIG. 2 is a graph illustrating the relationship between the coercive force (iHc) and maximum energy product ((BH)max), and the content of the rare earth element.

Referring to FIG. 2, the mutual effect of the element M and content of the rare earth element is illustrated. In FIG. 1, the coercive force (iHc) and maximum energy product ((BH)max) of the magnets by the methods of Example 1 are shown. The compositions were Nd-8B-balance Fe (comparative-A), and Nd-8B-(2~6) Zr-(0~15)Co-bal Fe (invention-B). As is evident from FIG. 2, the element M, i.e., Zr, is very effective for enhancing the maximum energy product ((BH)max) at a rare earth element content of less than 12%. This effect of Zr upon the maximum energy product ((BH)max) does not appear at a rare earth element content of 12% or more, but is exerted on the coercive force (iHc). The similar effects as illustrated in FIG. 2 are attained by the elements M other than Zr.

The M element will enhance the coercive force (iHc) in a range of a rare earth element content of from approximately 3% to 15%.

It is believed that, at a rare earth element content of less than 12%, particularly less than 10%, the coercive force is generated not by the $R_2Fe_{14}B$ compound, which is a stable tetragonal phase, as in the conventional R-Fe-B alloy, but by a microstructure mainly composed of a metastable $R_2F_{14}B$ compound with a solute M element, which is supersaturated in the main phase as a result of the rapid cooling. Usually, the M element in an amount of up to 2 atomic % can be stably solid-dissolved at a high temperature. The solid-solution in an amount of more than 2% of the M element is impossible, unless done by rapid cooling. In this case, the M element is present in the metastable compound. These considerations are supported by the result of an X-ray diffraction, as illustrated in FIGS. 3 and 4.

Figure 3:
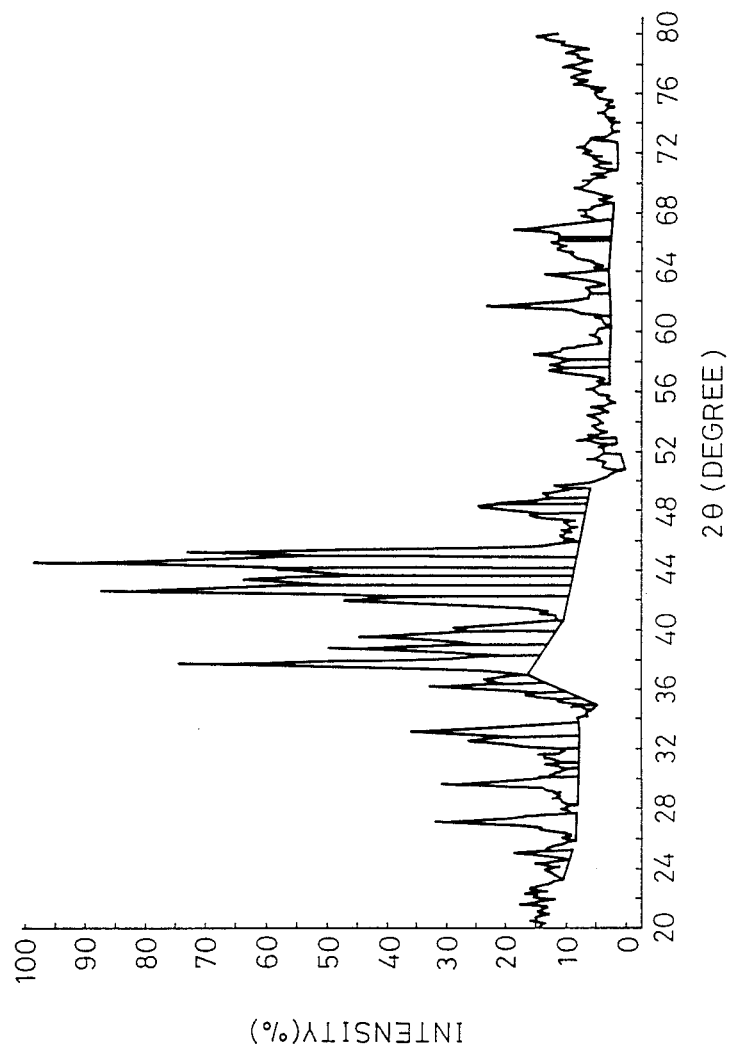
FIG. 3 is an X-ray diffraction chart of the 8Nd-4.5Zr-7.5B-bal Fe when rapidly cooled followed by heating at 700° C. for 10 minutes.
Figure 4:
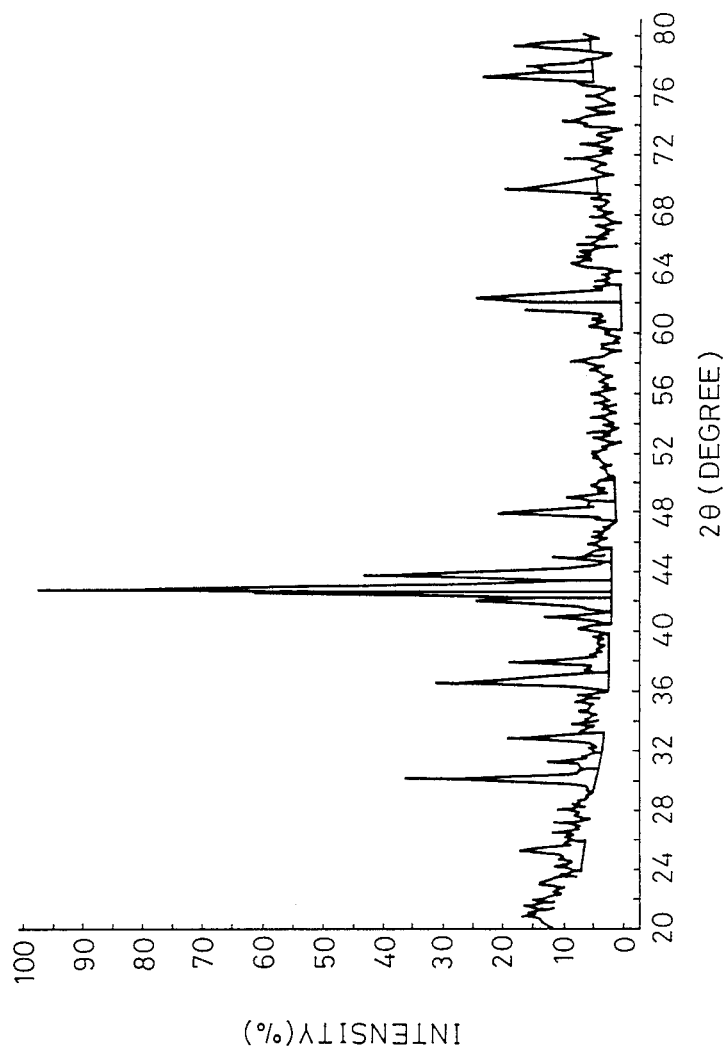
FIG. 4 is an X-ray diffraction chart of an ingot with the same composition as in FIG. 3, heated at 1150° C. for 4 hours.

FIG. 3 shows the X-ray diffraction chart of a magnet which has been rapidly cooled at a speed of 10 m/sec and consists substantially of the $R_2Fe_{14}B$ phase. FIG. 4 shows the X-ray diffraction chart of the as-cast ingot and the ingot which was subjected to homogenizing at a temperature of 1150° C. for 4 hours. This diffraction pattern is clearly different from that of FIG. 3, and the main constituent phase of the cast ingot is $RFe_7$. Accordingly, the M element has the effect of stabilizing the $R_2Fe_{14}B$ phase at even a small content of the rare earth element. This effect is attained only in the rapid cooling method, and not in the sintering method, and is outstanding at $5.5 \leq x < 12$, particularly, $6 \leq x < 10$; $4 \leq y < 12$, more preferably $4 \leq y \leq 10$; and, $2 \leq w \leq 10$.

The additive element M appears further to form and strengthen a sub-phase acting as the boundary phase for pinning the magnetic domain walls. The α-phase and other phases may be present as subphases.

It is noteworthy that, notwithstanding a low R content of less than 10%, the maximum energy product ((BH)max) attained according to the present invention is superior to that attained at an R content of 10% or more.

The present invention is further described by way of examples and comparative examples.

EXAMPLE 1

The alloys having the compositions as given in Table 1 were prepared by arc melting. The obtained alloys were formed into ribbons by the liquid-rapid cooling method, in which the alloy melt was injected onto the surface of a roll rotating at 10~80 m/sec, through a quartz nozzle under a presure of argon. The resultant ribbon was amorphous or finely crystalline. The ribbons were then annealed at a temperature range of from 550° to 900° C. The highest magnetic properties of each composition are given in Table 1.

TABLE 1

| | No. | Composition (atomic percentage) | Br (KG) | iHc (KOe) | $(BH)_{max}$ (MGOe) |
|---|---|---|---|---|---|
| Invention | 1 | 10.5Nd—5B—4Nb—bal Fe | 8.5 | 16.0 | 14.5 |
| " | 2 | 10.5Nd—5B—2Nb—bal Fe | 8.3 | 13.1 | 13.1 |
| " | 3 | 10.5Nd—5B—4Nb—10Co—bal Fe | 8.4 | 15.1 | 14.4 |
| " | 4 | 10.5Nd—5B—2Nb—10Co—bal Fe | 8.3 | 12.8 | 13.0 |
| " | 5 | 8Nd—2.5Pr—5B—4Nb—bal Fe | 8.4 | 16.5 | 14.3 |
| " | 6 | 8Nd—2.5Pr—5.5B—4Nb—10Co—bal Fe | 8.3 | 15.3 | 14.5 |
| " | 7 | 10.5Nd—5B—6Nb—bal Fe | 8.2 | 17.0 | 13.5 |
| " | 8 | 10.5Nd—7B—3.5Nb—7Co—bal Fe | 8.3 | 14.0 | 13.7 |
| " | 9 | 10.5Nd—5B—4Zr—bal Fe | 8.4 | 15.8 | 14.4 |
| " | 10 | 10.5Nd—5B—2Zr—bal Fe | 8.2 | 13.0 | 13.0 |
| " | 11 | 10.5Nd—5B—4Zr—10Co—bal Fe | 8.3 | 14.9 | 14.3 |

TABLE 1-continued

|  | No. | Composition (atomic percentage) | Br (KG) | iHc (KOe) | $(BH)_{max}$ (MGOe) |
|---|---|---|---|---|---|
| " | 12 | 10.5Nd—5B—2Zr—10Co—bal Fe | 8.2 | 12.7 | 13.0 |
| " | 13 | 8Nd—2.5Pr—5B—4Zr—bal Fe | 8.3 | 16.3 | 14.2 |
| " | 14 | 8Nd—2.5Pr—5.5B—4Zr—10Co—bal Fe | 8.3 | 15.1 | 14.4 |
| " | 15 | 10.5Nd—5B—6Zr—bal Fe | 8.2 | 17.0 | 13.5 |
| " | 16 | 10.5Nd—7B—3.5Zr—bal Fe | 8.4 | 14.4 | 14.2 |
| " | 17 | 10.5Nd—5.5B—3Nb—1Zr—bal Fe | 8.5 | 19.2 | 14.5 |
| " | 18 | 10Nd—1Pr—6B—3Zr—1Hf—bal Fe | 8.4 | 15.3 | 14.2 |
| " | 19 | 11Nd—6B—2Nb—2Ta—bal Fe | 8.3 | 14.9 | 14.0 |
| " | 20 | 10.5Nd—6B—2Nb—1Mo—bal Fe | 8.5 | 16.4 | 14.3 |
| " | 21 | 9Nd—1.5Pr—6B—2.5Nb—1W—bal Fe | 8.5 | 14.7 | 14.1 |
| " | 22 | 10Nd—1Pr—6B—10Co—2Nb—2Ta—bal Fe | 8.4 | 14.8 | 13.9 |
| Comparative | 23 | 10.5Nd—5B—bal Fe | 8.4 | 4.1 | 7.5 |
| " | 24 | 10.5Nd—5B—10Co—bal Fe | 8.2 | 3.7 | 7.0 |

As is apparent from Table 1, the coercive force (iHc) and maximum energy product ((BH)max) are improved by the addition of the M element.

The samples Nos. 1 through 22 according to the present invention, and the comparative samples 23 and 24, were exposed at a temperature of 40° C. for 100 hours in an atmosphere having a humidity of 90%. Rust particles 0.1~1.0 mm in size were generated on the comparative samples. Conversely, virtually no rust formed on the samples according to the present invention. Thus, it could be seen that the addition of the M element also improves the corrosion resistance.

EXAMPLE 2

The same process including exposure to a humid atmosphere as in Example 1 was carried out for the compositions $R_x(Fe_{1-z}Co_z)_{100-x-y-w}B_yM_w$ given in Table 2. The same results as in Example 1 were obtained.

TABLE 2

|  | No. | Composition (atomic percentage) | Br (KG) | iHc (KOe) | $(BH)_{max}$ (MGOe) |
|---|---|---|---|---|---|
| Invention | 1 | 10.5Nd—5B—2Mo—bal Fe | 8.3 | 12.1 | 13.9 |
| " | 2 | 10.5Nd—5B—4Mo—bal Fe | 7.9 | 12.6 | 13.0 |
| " | 3 | 10.5Nd—5B—2Hf—bal Fe | 8.3 | 12.8 | 13.1 |
| " | 4 | 10.5Nd—5B—4Hf—bal Fe | 8.4 | 14.0 | 14.1 |
| " | 5 | 10.5Nd—5B—2Ta—bal Fe | 8.4 | 13.0 | 14.1 |
| " | 6 | 10.5Nd—5B—4Ta—bal Fe | 8.1 | 14.1 | 13.5 |
| " | 7 | 10.5Nd—5B—2W—bal Fe | 8.3 | 12.2 | 13.8 |
| " | 8 | 10.5Nd—5B—4W—bal Fe | 8.0 | 12.7 | 13.1 |
| " | 9 | 8Nd—2.5Pr—5B—2mo—bal Fe | 8.3 | 12.2 | 13.8 |
| " | 10 | 8Nd—2.5Pr—5B—2Hf—bal Fe | 8.2 | 12.9 | 13.0 |
| " | 11 | 8Nd—2.5Pr—5B—2Ta—bal Fe | 8.3 | 13.1 | 14.0 |
| " | 12 | 8Nd—2.5Pr—5B—2W—bal Fe | 8.2 | 12.3 | 13.9 |
| " | 13 | 10.5Nd—5B—2Mo—7Co—bal Fe | 8.3 | 12.0 | 13.8 |
| " | 14 | 10.5Nd—5B—4Mo—10Co—bal Fe | 7.9 | 12.5 | 13.1 |
| " | 15 | 10.5Nd—5B—2Hf—7Co—bal Fe | 8.4 | 12.7 | 13.2 |
| " | 16 | 10.5Nd—5B—4Hf—10Co—bal Fe | 8.4 | 14.0 | 14.0 |
| " | 17 | 10.5Nd—5B—2Ta—7Co—bal Fe | 8.4 | 13.1 | 14.0 |
| " | 18 | 10.5Nd—5B—4Ta—10Co—bal Fe | 8.2 | 13.9 | 13.3 |
| " | 19 | 10.5Nd—5B—2W—7Co—bal Fe | 8.3 | 12.4 | 13.7 |
| " | 20 | 10.5Nd—5B—4W—10Co—bal Fe | 8.0 | 12.8 | 13.0 |
| " | 21 | 8Nd—2.5Pr—5B—2Mo—bal Fe | 8.3 | 12.3 | 13.8 |
| " | 22 | 8Nd—2.5Pr—5B—2Hf—bal Fe | 8.2 | 12.8 | 12.9 |
| " | 23 | 8Nd—2.5Pr—5B—2Ta—bal Fe | 8.4 | 13.0 | 14.1 |
| " | 24 | 8Nd—2.5Pr—5B—2W—bal Fe | 8.2 | 12.2 | 13.8 |
| Comparative | 25 | 10.5Nd—5B—bal Fe | 8.4 | 4.1 | 7.5 |
| " | 26 | 10.5Nd—5B—10Co—bal Fe | 8.2 | 3.7 | 7.0 |

EXAMPLE 3

The same process except for the exposure to humid atmosphere as in Example 1 was carried out for the compositions $Nd_x(Fe_{1-z}Co_z)_{100-x-y-w}B_yM_w$ given in Table 3. The same results as in Example 1 were obtained.

TABLE 3

|  | No. | Composition (atomic percentage) | Br (KG) | iHc (KOe) | $(BH)_{max}$ (MGOe) |
|---|---|---|---|---|---|
| Invention | 1 | 9Nd—5B—3.5Nb—bal Fe | 8.8 | 16.3 | 16.4 |
| " | 2 | 9Nd—5B—3.5Zr—bal Fe | 8.8 | 16.2 | 16.4 |
| " | 3 | 9Nd—5B—3.5Nb—12Co—bal Fe | 8.9 | 16.4 | 16.6 |
| " | 4 | 9Nd—5B—3.5Zr—12Co—bal Fe | 9.0 | 16.3 | 16.6 |
| " | 5 | 9Nd—8.5B—4Zr—bal Fe | 8.7 | 14.0 | 17.0 |
| " | 6 | 9Nd—8.5B—4Nb—bal Fe | 8.6 | 15.0 | 16.4 |
| " | 7 | 9.5Nd—7.5B—4Zr—7Co—bal Fe | 8.7 | 12.5 | 16.8 |
| " | 8 | 8Nd—5B—3Nb—bal Fe | 9.0 | 15.8 | 16.9 |
| " | 9 | 8Nd—5B—3Zr—15Co—bal Fe | 9.2 | 11.1 | 17.2 |
| " | 10 | 8Nd—5B—3Zr—bal Fe | 9.2 | 16.0 | 17.0 |

TABLE 3-continued

|  | No. | Composition (atomic percentage) | Br (KG) | iHc (KOe) | (BH)$_{max}$ (MGOe) |
|---|---|---|---|---|---|
| " | 11 | 8Nd—5B—3Nb—16Co—bal Fe | 9.0 | 15.9 | 17.1 |
| " | 12 | 7.5Nd—9b—4.5Zr—bal Fe | 8.5 | 11.0 | 15.4 |
| " | 13 | 7.5Nd—9B—4.5Nb—bal Fe | 8.5 | 11.0 | 15.3 |
| " | 14 | 7.5Nd—5.5B—3.5Zr—bal Fe | 9.7 | 15.0 | 18.7 |
| " | 15 | 7.5Nd—5B—3.5Nb—bal Fe | 9.7 | 15.2 | 18.8 |
| " | 16 | 7.5Nd—5B—2Nb—2Zr—bal Fe | 9.7 | 16.6 | 19.2 |
| " | 17 | 7.5Nd—5.5B—3.5Zr—14Co—bal Fe | 10.0 | 15.1 | 19.5 |
| " | 18 | 7.5Nd—5B—3.5Nb—12Co—bal Fe | 9.9 | 15.3 | 19.3 |
| " | 19 | 7.5Nd—5B—2Nb—2Zr—13Co—bal Fe | 9.9 | 16.4 | 18.0 |
| " | 20 | 7.5Nd—9B—4.5Zr—10Co—bal Fe | 8.6 | 11.0 | 15.7 |
| " | 21 | 6.5Nd—9.5B—6.5Zr—bal Fe | 8.3 | 10.0 | 15.0 |
| " | 22 | 9.5Nd—6.5B—4Mo—bal Fe | 8.7 | 13.2 | 15.7 |
| " | 23 | 9.5Nd—6.5B—4W—bal Fe | 8.7 | 13.3 | 15.9 |
| " | 24 | 7.5Nd—8.5B—4Ta—bal Fe | 8.6 | 11.5 | 15.7 |
| " | 25 | 7.5Nd—8.5B—4Hf—bal Fe | 8.8 | 12.0 | 15.8 |
| Comparative | 26 | 8Nd—5B—bal Fe | 9.0 | 4.7 | 8.0 |
| " | 27 | 8Nd—5B—15Co—bal Fe | 9.0 | 4.7 | 8.0 |
| " | 28 | 9Nd—7B—bal Fe | 8.9 | 4.4 | 7.5 |

EXAMPLE 4

The same process except for the exposure to humid atmosphere as in Example 1 was carried out for the compositions shown in Table 4. The samples were first magnetized by a vibrating magnetometer at 18 kOe and then pusle-magnetized at 40 kOe. The residual magentizations were measured after the respective magnetization procedures, and compared to obtaine the magnetization ratio of $Br_{18k}/Br_{40k}$. The results are given in Table 4.

TABLE 4

|  | No. | Composition | Br (KG) | iHc (KOe) | (BH)$_{max}$ (MGOe) | $\frac{Br_{18K}}{Br_{40K}}$ (%) |
|---|---|---|---|---|---|---|
| Invention | 1 | 10.5Nd—6B—4Nb—10Co—bal Fe | 8.4 | 14.1 | 14.4 | 0.97 |
| " | 2 | 10.5Nd—7B—4Zr—bal Fe | 8.4 | 13.8 | 14.4 | 0.97 |
| " | 3 | 10.5Nd—8B—4Zr—10Co—bal Fe | 8.3 | 12.8 | 14.3 | 0.98 |
| " | 4 | 10.5Nd—6B—4Hf—bal Fe | 8.3 | 12.8 | 13.1 | 0.96 |
| " | 5 | 9Nd—6.5B—3.5Nb—bal Fe | 8.8 | 11.5 | 16.4 | 0.98 |
| " | 6 | 7.5Nd—8.5B—5Zr—bal Fe | 9.0 | 10.2 | 15.2 | 0.99 |
| " | 7 | 6.5Nd—9.5B—6.5Zr—bal Fe | 8.4 | 9.0 | 14.9 | 0.99 |
| " | 8 | 9Nd—8B—4Ta—7Co—bal Fe | 8.7 | 11.0 | 15.8 | 0.98 |
| Comparative | 9 | 13.5Nd—6B—bal Fe | 7.8 | 12.0 | 12.5 | 0.92 |

As apparent from Table 4, the magnets according to the present invention are easily magnetizable.

EXAMPLE 5

The alloy having composition of 9.5Nd-8B-4Zr-bel Fe was prepared by arc melting. The obtained alloy was formed into ribbons by the liquid-rapid cooling method, in which the alloy melt was injected onto the surface of a roll rotating at 7.5~30 m/sec, through a quartx nozzle under the pressure of argon. The obtained ribbon was amorphous of finely crystalline. The ribbons were annealed at 750° C. for 10 minutes in an argon atomsphere. The obtained magnetic properties are given in Table 5.

TABLE 5

| No. | Substrate Speed (m/sec) | Br (KG) | iHc (KOe) | (BH)$_{max}$ (MGOe) |
|---|---|---|---|---|
| 1 | 7.5 | 8.7 | 11.3 | 16.2 |
| 2 | 10 | 8.8 | 11.4 | 16.5 |
| 3 | 15 | 8.7 | 11.8 | 16.3 |
| 4 | 20 | 8.7 | 11.7 | 16.1 |
| 5 | 30 | 8.5 | 11.6 | 15.6 |

For comparison, an alloy having the composition 9.5Nd-8B-bal Fe was prepared by the same process as above, except for annealing at 700° C. for 10 minutes. The obtained highest energy product ((BH)max) was 7 MGOe.

The above samples Nos. 1 through 5 were subjected to measurement of the temperature coefficient of the coercive force (iHc) and maximum energy product ((BH)max) in a temperature range of from 20° to 110° C. As a result, the following values, dBr/dT=0.08~0.11%/°C. and diHc/dT=0.34~0.40%/°C., were obtained.

EXAMPLE 6

Ribbon magnets having the compositions as given in Table 6 were pulverized into particles approximately 100 μm in size, mixed with a thermosetting resin, and pressed to produce bonded magnets having a density of about 6 gr/cc. The magnetic properties measured after pulse magnetizing are shown in Table 6.

TABLE 6

|  | No. | Composition (atomic percentage) | Br (KG) | iHc (KOe) | (BH)$_{max}$ (MGOe) |
|---|---|---|---|---|---|
| Invention | 1 | 9.5Nd—8B—4Zr—bal Fe | 7.1 | 12.0 | 10.5 |
| " | 2 | 9.5Nd—6B—4Nb—bal Fe | 6.8 | 12.5 | 9.6 |
| " | 3 | 7.5Nd—9B—4Zr—bal Fe | 6.7 | 9.2 | 9.3 |

TABLE 6-continued

|  | No. | Composition (atomic percentage) | Br (KG) | iHc (KOe) | (BH)$_{max}$ (MGOe) |
|---|---|---|---|---|---|
| " | 4 | 7.5Nd—9B—10Co—4Nb—bal Fe | 6.7 | 9.5 | 9.3 |
| Comparative | 5 | 9.5Nd—8B—bal Fe | 5.7 | 5.0 | 5.7 |
| " | 6 | 7.5Nd—8.5B—bal Fe | 4.5 | 3.4 | 2.3 |
| " | 7 | 13.5Nd—5B—bal Fe | 6.0 | 13.0 | 6.8 |

The magnetic properties of magnets Nos. 1 through 4 according to the present invention, when magnetized at 18 kOe, are 97% or more of the pulse-magnetized properties, and were excellent. In addition, the temperature characteristics were as excellent as those obtained in Example 5. The magnetic properties of the comparative magnet No. 7, when magnetized at 18 kOe, were 92% of the pulse-magnetized properties. The comparative sample was subjected to measurement of the temperature coefficient of the coercive force (iHc) and maximum energy product ((BH)max) in a temperature range of from 20° to 110° C. As a result, the following values, dBr/dT=0.14%/°C. and diHc/dT=0.41%/°C., were obtained.

EXAMPLE 7

The same process as in Example 1, including exposure to humid atmosphere, was carried out for the composition as given in Table 7.

TABLE 7

|  | No. | Composition (atomic percentage) | Br (KG) | iHc (KOe) | (BH)$_{max}$ (MGOe) |
|---|---|---|---|---|---|
| Invention | 1 | 10.5Nd—5B—2Ti—bal Fe | 8.5 | 11.5 | 14.1 |
| " | 2 | 10.5Nd—5B—4Ti—bal Fe | 8.4 | 12.0 | 14.0 |
| " | 3 | 10.5Nd—5B—2V—bal Fe | 8.4 | 12.0 | 14.0 |
| " | 4 | 10.5Nd—5B—4V—bal Fe | 7.9 | 12.5 | 13.8 |
| " | 5 | 10.5Nd—7B—4Ti—bal Fe | 8.2 | 13.5 | 13.4 |
| " | 6 | 8Nd—2.5Pr—5B—2V—bal Fe | 8.3 | 12.2 | 14.0 |
| " | 7 | 8Nd—2.5Pr—5B—2Ti—bal Fe | 8.4 | 11.8 | 14.0 |
| " | 8 | 10.5Nd—5B—2Ti—7Co—bal Fe | 8.5 | 11.4 | 14.0 |
| " | 9 | 10.5Nd—5B—4Ti—10Co—bal Fe | 8.4 | 12.0 | 13.9 |
| " | 10 | 10.5Nd—5B—2V—7Co—bal Fe | 8.4 | 12.1 | 14.0 |
| " | 11 | 10.5Nd—5B—4V—10Co—bal Fe | 8.0 | 12.4 | 13.7 |
| " | 12 | 8Nd—2.5Pr—5B—2V—7Co—bal Fe | 8.3 | 12.2 | 13.9 |
| " | 13 | 8Nd—2.5Pr—5B—2Ti—7Co—bal Fe | 8.4 | 11.9 | 14.1 |
| " | 14 | 10Nd—0.5Pr—6B—2.5Ti—1V—bal Fe | 8.2 | 14.2 | 14.0 |
| Comparative | 15 | 10.5Nd—5B—bal Fe | 8.4 | 4.1 | 7.5 |
| " | 16 | 10.5Nd—5B—10Co—bal Fe | 8.2 | 3.7 | 7.0 |

The magnetic properties are also given in Table 7. The same corrosion resistance as in Example 1 was obtained.

EXAMPLE 8

The same process except for exposure to humid atmosphere as in Example 1 was carried out for the compositions $Nd_x(Fe_{1-z}Co_z)_{100-x-y-w}B_yM_w$ as given in Table 8.

TABLE 8

|  | No. | Composition (atomic percentage) | Br (KG) | iHc (KOe) | (BH)$_{max}$ (MGOe) |
|---|---|---|---|---|---|
| Invention | 1 | 7.5—1.5Pr—5B—3Ti—bal Fe | 9.2 | 15.1 | 16.6 |
| " | 2 | 8.5N—5B—3V—bal Fe | 9.0 | 15.4 | 16.4 |
| " | 3 | 8Nd—1Pr—5.5B—3Ti—12Co—bal Fe | 9.3 | 15.3 | 16.9 |
| " | 4 | 9Nd—0.5Pr—5.5B—3V—12Co—bal Fe | 9.1 | 15.3 | 16.5 |
| " | 5 | 7.5Nd—8B—4Ti—bal Fe | 8.5 | 9.0 | 15.2 |
| " | 6 | 7.5Nd—8B—5Ti—10Co—bal Fe | 8.6 | 9.8 | 15.4 |
| " | 7 | 7.5Nd—9B—4V—bal Fe | 8.3 | 8.5 | 15.1 |
| " | 8 | 9Nd—7B—4Ti—bal Fe | 9.0 | 12.7 | 15.4 |
| " | 9 | 9Nd—6.5B—3Ti—1V—bal Fe | 8.7 | 12.5 | 15.3 |
| Comparative | 10 | 8Nd—5B—bal Fe | 9.0 | 4.7 | 8.0 |
| " | 11 | 8Nd—5B—15Co—bal Fe | 9.0 | 4.7 | 8.0 |
| " | 12 | 9Nd—7B—bal Fe | 8.9 | 4.4 | 7.5 |
| " | 13 | 8Nd—8B—bal Fe | 8.9 | 4.5 | 7.5 |

EXAMPLE 9

The same process as in Example 6 was carried out. The result is given in Table 9.

TABLE 9

|  | No. | Composition | Br (KG) | iHc (KOe) | (BH)$_{max}$ (MGOe) | $\frac{Br_{18K}}{Br_{40K}}$ (%) |
|---|---|---|---|---|---|---|
| Invention | 1 | 10.5Nd—6B—4Ti—bal Fe | 8.3 | 13.5 | 13.4 | 0.97 |
| " | 2 | 10.5Nd—7B—4V—bal Fe | 8.3 | 12.5 | 13.5 | 0.97 |
| " | 3 | 10.5Nd—6.5B—4Ti—10Co—bal Fe | 8.4 | 12.4 | 13.9 | 0.98 |
| " | 4 | 9Nd—7B—4Ti—bal Fe | 8.8 | 12.7 | 15.4 | 0.97 |

TABLE 9-continued

|  | No. | Composition | Br (KG) | iHc (KOe) | $(BH)_{max}$ (MGOe) | $\frac{Br_{18K}}{Br_{40K}}$ (%) |
|---|---|---|---|---|---|---|
| " | 5 | 9Nd—7B—4Ti—10Co—bal Fe | 8.8 | 12.0 | 15.5 | 0.98 |
| " | 6 | 7.5Nd—8B—4Ti—bal Fe | 8.5 | 9.1 | 15.2 | 0.97 |
| " | 7 | 9Nd—7B—4V—bal Fe | 8.7 | 11.0 | 15.3 | 0.97 |
| Comparative | 8 | 13.5Nd—6B—bal Fe | 7.8 | 12.0 | 12.5 | 0.92 |

EXAMPLE 10

The same process as in Example 4 was carried out. The result is given in Table 10.

TABLE 10

|  | No. | Composition (atomic percentage) | Br (KG) | iHc (KOe) | $(BH)_{max}$ (MGOe) |
|---|---|---|---|---|---|
| Invention | 1 | 9.5Nd—7B—4Ti—bal Fe | 6.8 | 12.0 | 9.4 |
| " | 2 | 9.5Nd—7B—4V—bal Fe | 6.9 | 10.5 | 9.7 |
| " | 3 | 7.5Nd—8B—4Ti—bal Fe | 6.8 | 9.1 | 9.0 |
| " | 4 | 9Nd—7B—4.5Ti—10Co—bal Fe | 6.9 | 11.8 | 10.0 |
| Comparative | 5 | 9.5Nd—7B—bal Fe | 5.7 | 5.0 | 5.7 |
| " | 6 | 7.5Nd—8B—bal Fe | 4.5 | 3.4 | 2.3 |
| " | 7 | 13.5Nd—5B—bal Fe | 6.0 | 13.0 | 6.8 |

The magnetic properties of magnets Nos. 1 through 4 according to the present invention, when magnetized at 18 kOe, were 97% or more of the pulse-magnetized properties, and were excellent. In addition, the temperature characteristics were as excellent as those obtained in Example 5. The magnetic properties of comparative magnet No. 7, when magnetized at 18 kOe, were 92% of the pulse-magnetized properties. The comparative sample was subjected to measurement of the temperature coefficient of the coercive force (iHc) and maximum energy product ((BH)max) in a temperature range of from 20° to 110° C. As a result, the following values, dBr/dT=0.14%/°C. and diHc/dT=0.41%/°C., were obtained.

We claim:

1. A permanent magnet which consists of a composition of $\{R_a(Ce_bLa_{1-b})_{1-a}\}x(Fe_{1-z}Co_z)_{100-x-y-w}B_yM_w$ (R is at least one rare earth element except for La and Ce but including Y, $5.5 \leq x < 12$, $2 \leq y < 15$, $0 \leq z \leq 0.7$, $0.1 \leq w \leq 10$, $0.80 \leq a \leq 1.00$, $0 \leq b \leq 1$, M is at least one element selected from the group consisting of Zr, Nb, Mo, Hf, Ta, W, Ti, and V, having a structure including fine crystals formed by a rapid cooling of a melt having said composition, and in which the presence of said at least one M element increases the maximum energy product (BH)max) to a value higher than that of a composition wherein x is higher than 12.

2. A permanent magnet according to claim 1, consisting of powder having said composition and said structure.

3. A permanent magnet according to claim 2, wherein said powder is pressed in the form of a magnet body.

4. A permanent magnet according to claim 2, wherein the powder is obtained by pulverizing a ribbon obtained by the rapid cooling.

5. A permanent magnet according to claim 1, consisting of powder having said composition and said structure and an organic resin binder or metallic binder.

6. A permanent magnet according to claim 5, wherein the powder is obtained by pulverizing a ribbon obtained by the rapid cooling.

7. A permanent magnet according to claim 1, 2, 3, 4, 5, or 6, having been magnetized at a field of approximately 20 kOe until a magnetization ratio of at least 95%.

8. A permanent magnet according to claim 1, 2, 3, 4, 5, or 6, wherein the content (x) of rare earth element is less than 10.

9. A permanent magnet according to claim 8, wherein the content (x) of rare earth element is at least 6.

10. A permanent magnet according to claim 8, wherein the content (y) of boron is $4 \leq y \leq 12$.

11. A permanent magnet according to claim 1, 2, 3, 4, 5, or 6, wherein M is at least one element selected from the group consisting of Zr, Nb, Hf, Ta, W, and V.

12. A permanent magnet according to claim 11, wherein M is Zr.

13. A permanent magnet according to claim 11, wherein M is Nb.

14. A permanent magnet according to claim 11, wherein M is Mo.

15. A permanent magnet according to claim 11, wherein M is Hf.

16. A permanent magnet according to claim 11, wherein M it Ta.

17. a permanent magnet according to claim 11, wherein M is W.

18. A permanent magent according to claim 11, wherein M is V.

19. A permanent magnet according to claim 1, 2, 3, 4, 5, or 6, having a coercive force (iHc) of at least 7 kOe.

20. A permanent magnet according to claim claim 2 or 3, having a maximum energy product ((BH)max) of more than 8 MGOe.

21. A permanent magnet according to claim 1, wherein the content (w) of said M is $2 \leq w \leq 10$.

* * * * *

REEXAMINATION CERTIFICATE (1700th)

United States Patent [19]

Yajima et al.

[11] B1 4,836,868

[45] Certificate Issued May 12, 1992

[54] PERMANENT MAGNET AND METHOD OF PRODUCING SAME

[75] Inventors: Kohichi Yajima, Urawa; Osamu Kohmoto, Kamagaya; Tetsuhito Yoneyama, Narashino, all of Japan

[73] Assignee: TDK Corporation

Reexamination Request:
No. 90/002,141, Sep. 18, 1990

Reexamination Certificate for:
Patent No.: 4,836,868
Issued: Jun. 6, 1989
Appl. No.: 38,195
Filed: Apr. 14, 1987

[30] Foreign Application Priority Data

| | | | |
|---|---|---|---|
| Apr. 15, 1986 | [JP] | Japan | 61-86850 |
| Apr. 23, 1986 | [JP] | Japan | 61-94247 |
| May 14, 1986 | [JP] | Japan | 61-109970 |
| May 14, 1986 | [JP] | Japan | 61-109971 |
| May 14, 1986 | [JP] | Japan | 61-109972 |
| May 15, 1986 | [JP] | Japan | 61-111087 |
| Feb. 5, 1987 | [JP] | Japan | 62-23509 |
| Mar. 17, 1987 | [JP] | Japan | 62-052215 |
| Mar. 17, 1987 | [JP] | Japan | 62-062198 |

[51] Int. Cl.⁵ .............................................. H01F 1/053

[52] U.S. Cl. .................................. 148/302; 420/83; 420/121; 75/244

[58] Field of Search ................... 148/302; 420/83, 121

[56] References Cited

FOREIGN PATENT DOCUMENTS

| 0101552 | 2/1984 | European Pat. Off. |
| 0175222 | 3/1986 | European Pat. Off. |
| 0187538 | 7/1986 | European Pat. Off. |
| 59-219904 | 12/1984 | Japan |
| 61-159709 | 7/1986 | Japan |
| 61-159710 | 7/1986 | Japan |
| 61-174364 | 8/1986 | Japan |

*Primary Examiner*—John P. Sheehan

[57] ABSTRACT

In an R-Fe-B permanent magnet produced by a process including a rapid cooling, a composition of $$\{R_a(Ce_bLa_{1-b})_{1-a}\}(Fe_{1-z}Co_z)_{100-x-y-w}B_yM_w$$

(R is at least one rare earth element except for La and Ce but including Y, $5.5 \leq x < 12$, $2 \leq y < 15$, $0 \leq z \leq 0.7$, $0 < w \leq 10$, $0.80 \leq a \leq 1.00$, $0 \leq b \leq 1$, M is Zr, Nb, Mo, Hf, Ta, W, Ti, and/or V) is proposed. The presence of the M element increases a ((BH)max) to a value higher than that of a composition wherein x is higher than 12 and makes the magnet more easily magnetizable.

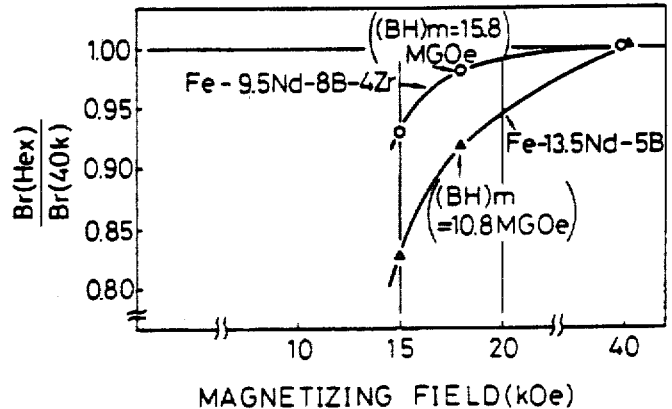

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1 to 21 is confirmed.

* * * * *